(12) United States Patent  (10) Patent No.: US 9,124,414 B2
Sima  (45) Date of Patent: Sep. 1, 2015

(54) RECEIVER

(71) Applicant: Huawei Technologies Co., Ltd., Shenzhen, Guangdong (CN)

(72) Inventor: Yu Sima, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/486,579

(22) Filed: Sep. 15, 2014

(65) Prior Publication Data

US 2015/0078502 A1    Mar. 19, 2015

(30) Foreign Application Priority Data

Sep. 16, 2013 (CN) .......................... 2013 1 0422582

(51) Int. Cl.
*H03D 3/24* (2006.01)
*H04L 7/033* (2006.01)

(52) U.S. Cl.
CPC .................................... *H04L 7/0331* (2013.01)

(58) Field of Classification Search
CPC ...................................................... H04L 27/22
USPC ........................................................ 375/376
See application file for complete search history.

(56) References Cited

U.S. PATENT DOCUMENTS

| 6,040,738 | A | 3/2000 | Uchida |
| 2006/0255874 | A1 | 11/2006 | Okazaki et al. |
| 2009/0055677 | A1 | 2/2009 | Chen |
| 2009/0168843 | A1* | 7/2009 | Waters et al. ................. 375/130 |
| 2010/0091688 | A1* | 4/2010 | Staszewski et al. ........... 370/277 |
| 2010/0330931 | A1 | 12/2010 | Uehara et al. |
| 2012/0134447 | A1 | 5/2012 | Sato et al. |

FOREIGN PATENT DOCUMENTS

| CN | 1220524 A | 6/1999 |
| CN | 1925364 A | 3/2007 |
| CN | 101373983 A | 2/2009 |
| CN | 102460984 A | 5/2012 |
| CN | 102480300 A | 5/2012 |

* cited by examiner

*Primary Examiner* — Lihong Yu
(74) *Attorney, Agent, or Firm* — Leydig, Voit & Mayer, Ltd.

(57) ABSTRACT

The present invention provides a receiver, including: a crystal oscillator, a phase-locked loop, a radio frequency module, an analog baseband processing module, an adjusting module, and a digital baseband processing module, where the radio frequency module demodulates a radio signal to obtain an original analog baseband signal; the analog baseband processing module processes the original analog baseband signal to obtain a first digital baseband signal; when demodulating the first digital baseband signal, the digital baseband processing module detects the rate deviation and sends the rate deviation to the phase-locked loop; and the adjusting module adjusts the first digital baseband signal, so that a rate of an adjusted first digital baseband signal is consistent with a rate of a preset reference signal.

8 Claims, 2 Drawing Sheets

// RECEIVER

CROSS-REFERENCE TO RELATED APPLICATION

This application claims priority to Chinese Patent Application No. 201310422582.8, filed Sep. 16, 2013, which is hereby incorporated by reference in its entirety.

TECHNICAL FIELD

The present invention relates to the field of communications technologies, and in particular to a receiver.

BACKGROUND

A temperature compensated crystal oscillator (Temperature Compensated Crystal Oscillator, TCXO), as a reference oscillator, may provide a clock source for a receiver or a transmitter in devices such as a mobile terminal and a base station. The transmitter and the receiver in the devices both mainly include: a radio frequency module (Radio Frequency, RF), an analog baseband processing module (Analog Base Band, ABB), and a digital baseband processing module (Digital Baseband, DBB). When the receiver in the mobile terminal receives a radio signal sent by the base station, the RF module in the receiver converts the radio signal into an original analog baseband signal, and sends the original baseband signal to the ABB processing module; the ABB processing module performs analog-to-digital conversion on the original baseband signal to obtain a digital baseband signal, and sends the digital baseband signal to the DBB processing module; the DBB processing module demodulates and decodes the digital baseband signal to obtain an original digital signal. When the receiver in the mobile terminal sends a radio signal to the base station, the DBB processing module in the receiver codes and modulates an original digital signal to obtain a digital baseband signal, and sends the digital baseband signal to the ABB processing module; the ABB processing module converts the digital baseband signal into an original analog baseband signal, and sends the original analog baseband signal to the RF module; the RF module converts the original analog baseband signal into a radio signal, and transmits the radio signal.

After the TCXO works for a period of time, with the change of temperatures, a frequency deviation increases and exceeds an acceptable error range of a standard clock frequency. As a result, a working clock of modules such as the ABB processing module and the DBB processing module in the receiver of the mobile terminal does not match a working clock of modules such as the ABB processing module and DBB processing module in the transmitter of the base station. Consequently, a rate of sending data by the transmitter of the base station does not match a rate of receiving data by the receiver of the mobile terminal, thereby affecting receiving performance of the receiver of the mobile terminal.

In the prior art, as shown in FIG. 1, an automatic frequency control AFC module is added to a DBB processing module of a receiver, and in a process of demodulating a digital baseband signal, information about a rate deviation between the digital baseband signal of the DBB processing module and a preset reference signal is detected and sent to a TCXO clock to adjust a clock signal of the TCXO. However, when the TCXO serves as a clock source of a plurality of receivers, the clock signal of the TCXO is adjusted according to frequency deviation information of one of the plurality of receivers, which affects a working clock of other receivers, thereby affecting receiving performance of the other receivers.

SUMMARY

The present invention provides a receiver, so as to solve a problem in the prior art that receiving performance of other receivers connected to a crystal oscillator is affected when a receiver adjusts the crystal oscillator according to a frequency deviation.

A first aspect of the present invention provides a receiver, including: a crystal oscillator, a phase-locked loop, a radio frequency module, an analog baseband processing module, an adjusting module, and a digital baseband processing module.

The crystal oscillator is configured to separately output a first clock signal as a reference clock to the phase-locked loop, the radio frequency module, and the analog baseband processing module.

The phase-locked loop is configured to: adjust a frequency adjustment coefficient according to a rate deviation sent by the digital baseband processing module; perform frequency division or frequency multiplication processing on the first clock signal according to an adjusted frequency adjustment coefficient, to obtain a second clock signal; and send the second clock signal to the digital baseband processing module to serve as a reference clock of the digital baseband processing module.

The radio frequency module is configured to receive a radio signal sent by a transmitter, and demodulate the radio signal to obtain an original analog baseband signal.

The analog baseband processing module is configured to perform, based on a clock frequency of the first clock signal, analog-to-digital conversion processing on the original analog baseband signal, to obtain a first digital baseband signal.

The digital baseband processing module is configured to: demodulate and decode the first digital baseband signal to obtain signal source information; detect the first digital baseband signal in a demodulation process to obtain a rate deviation between the first digital baseband signal and a preset reference signal; and send the rate deviation to the phase-locked loop, where the preset reference signal is a digital baseband signal obtained after the analog baseband processing module performs, based on a clock signal with no deviation, the analog-to-digital conversion processing on the original analog baseband signal.

The adjusting module is configured to adjust the first digital baseband signal, so that a rate of an adjusted first digital baseband signal is consistent with a rate of the preset reference signal, and send the adjusted first digital baseband signal to the digital baseband processing module.

With reference to the first aspect, in a first feasible implementation manner of the first aspect, the adjusting module includes: a first first-in first-out memory and a first resampling module.

The first first-in first-out memory is configured to buffer the first digital baseband signal output by the analog baseband processing module.

The first resampling module is configured to resample the first digital baseband signal buffered by the first first-in first-out memory to obtain the adjusted first digital baseband signal, so that the rate of the adjusted first digital baseband signal is consistent with the rate of the preset reference signal, and send the adjusted first digital baseband signal to the digital baseband processing module.

With reference to the first feasible implementation manner of the first aspect, in a second feasible implementation manner, the adjusting module further includes: a second first-in first-out memory and a second resampling module.

The second first-in first-out memory is configured to buffer a second digital baseband signal output by the digital baseband processing module, where the second digital baseband signal is a digital baseband signal obtained after the digital baseband processing module codes and modulates the signal source information.

The second resampling module is configured to resample the second digital baseband signal buffered by the second first-in first-out memory to obtain an adjusted second digital baseband signal, so that a rate of the adjusted second digital baseband signal is consistent with the rate of the first digital baseband signal, and send the adjusted second digital baseband signal to the analog baseband processing module.

The analog baseband processing module is further configured to perform digital-to-analog conversion on the adjusted second digital baseband signal to obtain a to-be-transmitted analog baseband signal, and send the to-be-transmitted analog baseband signal to the radio frequency module.

The radio frequency module is further configured to modulate the to-be-transmitted analog baseband signal to obtain a transmit signal, and transmit the transmit signal.

With reference to the first and second feasible implementation manners of the first aspect, in a third feasible implementation manner, the receiver further includes:

a first filter, configured to filter the adjusted first digital baseband signal to obtain a filtered first digital baseband signal, and output the filtered first digital baseband signal to the digital baseband processing module.

With reference to the three feasible implementation manners of the first aspect, in a fourth feasible implementation manner, the receiver further includes:

a second filter, configured to filter the adjusted second digital baseband signal to obtain a filtered second digital baseband signal, and output the filtered second digital baseband signal to the analog baseband processing module.

With reference to the four feasible implementation manners of the first aspect, in a fifth feasible implementation manner, the crystal oscillator is a temperature compensated crystal oscillator TCOX or a digitally compensated crystal oscillator DCXO.

In the present invention, a digital baseband processing module demodulates and decodes a first digital baseband signal to obtain signal source information; detects the first digital baseband signal in a demodulation process to obtain a rate deviation between the first digital baseband signal and a preset reference signal; and sends the rate deviation to a phase-locked loop, so that the phase-locked loop adjusts a frequency adjustment coefficient according to the rate deviation sent by the digital baseband processing module, performs frequency division or frequency multiplication processing on a first clock signal according to an adjusted frequency adjustment coefficient to obtain a second clock signal, and sends the second clock signal to the digital baseband processing module to serve as a reference clock of the digital baseband processing module. In addition, an adjusting module is used to adjust a first digital baseband signal of an analog baseband processing module, so that a rate of an adjusted first digital baseband signal is consistent with a rate of the preset reference signal, and sends the adjusted first digital baseband signal to the digital baseband processing module. In this way, a frequency deviation of a receiver is adjusted on the premise that receiving performance of other receivers connected to a crystal oscillator is not affected.

DESCRIPTION OF EMBODIMENTS

To make the objectives, technical solutions, and advantages of the embodiments of the present invention clearer, the following clearly describes the technical solutions in the embodiments of the present invention with reference to the accompanying drawings in the embodiments of the present invention. Apparently, the described embodiments are a part rather than all of the embodiments of the present invention. All other embodiments obtained by persons of ordinary skill in the art based on the embodiments of the present invention without creative efforts shall fall within the protection scope of the present invention.

Figure 1:
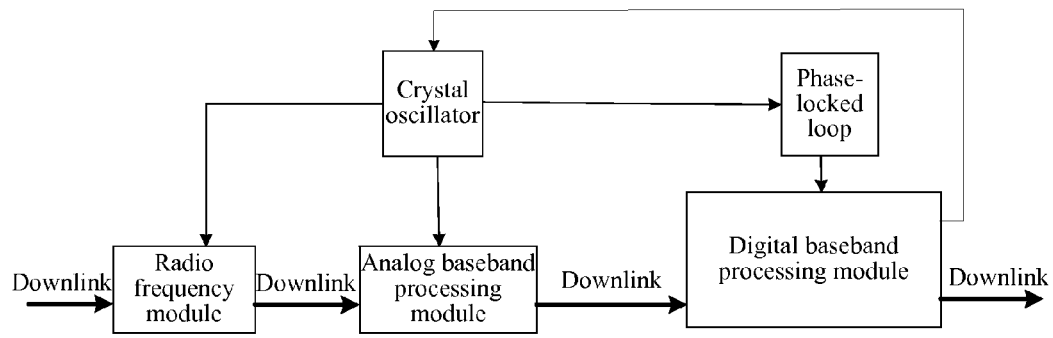
FIG. 1 is a schematic structural diagram of a receiver in the prior art.
Figure 2:
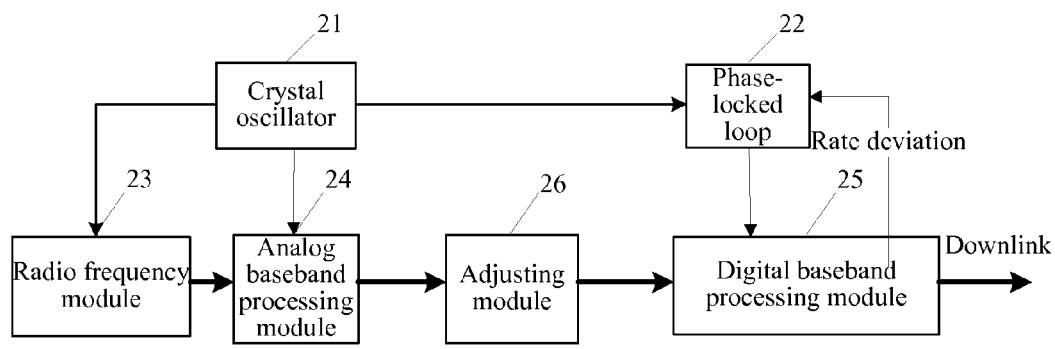
FIG. 2 is a schematic structural diagram of an embodiment of a receiver according to the present invention.

FIG. 2 is a schematic structural diagram of an embodiment of a receiver according to the present invention. As shown in FIG. 2, the receiver includes:

a crystal oscillator 21, a phase-locked loop 22, a radio frequency module 23, an analog baseband processing module 24, a digital baseband processing module 25, and an adjusting module 26.

The crystal oscillator 21 is configured to separately output a first clock signal as a reference clock to the phase-locked loop 22, the radio frequency module 23, and the analog baseband processing module 24.

The phase-locked loop 22 is configured to: adjust a frequency adjustment coefficient according to a rate deviation sent by the digital baseband processing module 25; perform frequency division or frequency multiplication processing on the first clock signal according to an adjusted frequency adjustment coefficient to obtain a second clock signal; and send the second clock signal to the digital baseband processing module 25 to serve as a reference clock of the digital baseband processing module 25.

The radio frequency module 23 is configured to receive a radio signal sent by a transmitter, and demodulate the radio signal to obtain an original analog baseband signal.

The analog baseband processing module 24 is configured to perform, based on a clock frequency of the first clock signal, analog-to-digital conversion processing on the original analog baseband signal, to obtain a first digital baseband signal.

The digital baseband processing module 25 is configured to: demodulate and decode the first digital baseband signal to obtain signal source information; detect the first digital baseband signal in a demodulation process to obtain a rate deviation between the first digital baseband signal and a preset reference signal; and send the rate deviation to the phase-locked loop 22, where the preset reference signal is a digital baseband signal obtained after the analog baseband processing module 24 performs, based on a clock signal with no deviation, the analog-to-digital conversion processing on the original analog baseband signal.

The adjusting module 26 is configured to adjust the first digital baseband signal, so that a rate of an adjusted first digital baseband signal is consistent with a rate of the preset reference signal, and send the adjusted first digital baseband signal to the digital baseband processing module 25.

In a modern mobile phone, a digital baseband processing module may generally include: an MCU unit, a DSP unit, and an ASIC unit, and an analog baseband processing module may generally include: a radio frequency interface unit, an audio coding and decoding unit, and some A/DC and D/AC units.

A microcontroller (Microcontroller Unit, MCU) is equivalent to a CPU in a computer. The MCU is generally a chip of a reduced instruction set computer (RISC) and generally provides some user interfaces, system control, and the like. The MCU generally includes a CPU (central processing unit) core, and a single-chip microcomputer support system. Microcontroller units of most mobile phones use ARM processor cores. The MCU may generally execute the following functions: system control (System Control), communication control (Communication Control), identity authentication (Authentication), radio frequency monitoring (RF Monitoring), working mode control (Power up/down Control), accessory monitoring (Accessory Monitoring), battery monitoring (Battery Monitoring), and the like.

The DSP is an abbreviation of Digital signal processing. A DSP of a mobile phone is formed by a DSP kernel, a built-in RAM, and a ROM loaded with software code. The DSP generally provides the following functions: radio frequency control, channel coding; balancing, interleaving, de-interleaving, AGC, AFC, SYCN, password algorithm, adjacent cell monitoring, and the like. In addition, the DSP may also provide some other functions, including generation of a dual-tone multi-frequency tone and cancellation of some short-time echoes. A DSP of a GSM mobile phone generally has a burst (Burst) building function.

The ASIC is an abbreviation of application specific integrated circuit. In mobile phones, the ASIC generally includes the following functions: providing an interface between an MCU and a user module; providing an interface between an MCU and a DSP; providing interfaces among an MCU, a DSP, and a radio frequency logic interface circuit; generating a clock; providing a user interface; providing a SIM card interface (for a GSM mobile phone) or providing a UIM interface (for a CDMA mobile phone); providing time management and an external communications interface, and the like.

The audio coding and decoding unit may implement the following functions: A/D and D/A conversion of an audio signal, PCM coding and decoding, audio path conversion, pre-amplification of a transmit voice, drive amplification of a receive voice, dual-tone multi-frequency DTMF signal generation, and the like.

The radio frequency interface unit is configured to: in a reception aspect, receive an analog baseband signal output by a radio frequency circuit, and convert the received analog baseband signal into a digital baseband signal by means of ADC processing, where the digital baseband signal is sent to a DSP unit for further processing; and in a transmission aspect, receive a digital baseband signal output by the DSP unit, and convert the digital baseband signal into an analog baseband signal TXI/Q by means of GMSK modulation (or QPSK modulation and the like) and DAC conversion. The TXI/Q signal is sent to a transmit I/Q modulation circuit at a radio frequency portion of a transmitter, and is modulated onto a transmit medium frequency (or radio frequency) carrier.

In a demodulation process, the digital baseband processing module 25 detects the first digital baseband signal to obtain the rate deviation between the first digital baseband signal and the preset reference signal. The adjusting module 26 adjusts the first digital baseband signal according to the rate deviation, so that the rate of the adjusted first digital baseband signal is consistent with the rate of the preset reference signal, which is not completed in one cyclic process, but completed in a plurality of cyclic processes. That is, the digital baseband processing module 25 obtains, by means of detection, the rate deviation between the first digital baseband signal and the preset reference signal, and after the adjusting module 26 adjusts the first digital baseband signal according to the rate deviation, the digital baseband processing module 25 may detect a rate deviation between the adjusted first digital baseband signal and the preset reference signal again until the rate deviation between the adjusted first digital baseband signal and the preset reference signal falls within a range of allowable error.

The transmitter may be a transmitter, in a base station, for sending a radio signal to a user equipment or other base stations, and may also be a transmitter, in a user equipment, for sending a radio signal to a base station or other user equipments. The receiver may be a receiver, in a base station, for receiving a radio signal sent by a user equipment or other base stations, and may also be a receiver, in a user equipment, for receiving a radio signal sent by a base station or other user equipments. The user equipment may be a communications terminal such as a mobile phone and a vehicle terminal. The crystal oscillator may be a temperature compensated crystal oscillator (Temperature Compensated crystal Oscillator, TCXO), and may also be a digitally compensated crystal oscillator (digitally compensated crystal oscillator, DCXO).

A mobile phone is used as an example: when the mobile phone supports dual card dual standby, wireless fidelity (Wireless Fidelity, WIFI) technology, global positioning system (Global Positioning System, GPS), and the like, each receiving system is one channel, and each channel requires a separate receiver. Therefore, in the foregoing application scenario, the crystal oscillator 21 in the mobile phone needs to be connected to a plurality of receivers for concurrent working Dual card dual standby refers to that one mobile phone is capable of supporting two SIM cards and concurrently accessing two mobile networks.

That a user equipment receives a radio signal sent by a base station is used as an example for description. When a receiver in the user equipment receives a radio signal sent by a transmitter in a base station, the radio frequency module 23 in the receiver demodulates the radio signal to obtain an original analog baseband signal, the analog baseband processing module 24 performs analog-to-digital conversion processing on the original analog baseband signal to obtain a first digital baseband signal, and the digital baseband processing module 25 demodulates and decodes the first digital baseband signal to obtain signal source information. In a demodulation process, an automatic frequency control AFC module in the digital baseband processing module 25 detects the first digital baseband signal to obtain a rate deviation between the first digital baseband signal and a preset reference signal, and sends the rate deviation to the phase-locked loop 22, so that the phase-locked loop 22 adjusts a frequency adjustment coefficient according to the rate deviation, performs, according to an adjusted frequency adjustment coefficient, frequency division or frequency multiplication processing on a first clock signal provided by the crystal oscillator, so as to obtain a second clock signal, and provides the second clock signal to the digital baseband processing module 25. The adjusting module 26 adjusts the rate of the first digital baseband signal, so that a rate of the adjusted first digital baseband signal is consistent with the rate of the preset reference signal, and sends the adjusted first digital baseband signal to the digital baseband processing module 25, thereby eliminating a clock frequency error caused by long-term working of the crystal oscillator 21.

The preset reference signal is a digital baseband signal obtained after the analog baseband processing module 24 performs, based on a clock signal with no deviation, the analog-to-digital conversion processing on the original analog baseband signal, that is, a digital baseband signal at a transmitter end. When a frequency of the crystal oscillator 21 deviates, the rate deviation between the first digital baseband signal obtained by means of processing by the digital baseband processing module 25 and the preset reference signal is a non-zero value, or exceeds a range of allowable error. When no frequency of the crystal oscillator 21 deviates, the rate deviation between the first digital baseband signal obtained by means of processing by the digital baseband processing module 25 and the preset reference signal is zero, or does not exceed a range of allowable error.

In this embodiment, a digital baseband processing module demodulates and decodes an adjusted first digital baseband signal that is sent by an adjusting module, to obtain signal source information; detects the first digital baseband signal in a demodulation process to obtain a rate deviation between the first digital baseband signal and a preset reference signal; and sends the rate deviation to a phase-locked loop, so that the phase-locked loop adjusts a frequency adjustment coefficient according to the rate deviation sent by the digital baseband processing module, performs frequency division or frequency multiplication processing on a first clock signal according to an adjusted frequency adjustment coefficient to obtain a second clock signal, and sends the second clock signal to the digital baseband processing module to serve as a reference clock of the digital baseband processing module. In addition, the adjusting module is used to adjust a first digital baseband signal of an analog baseband processing module according to the rate deviation, so that a rate of an adjusted first digital baseband signal is consistent with a rate of the preset reference signal, and sends the adjusted first digital baseband signal to the digital baseband processing module. In this way, a frequency deviation of a receiver is adjusted on the premise that receiving performance of other receivers connected to a crystal oscillator is not affected.

Figure 3:
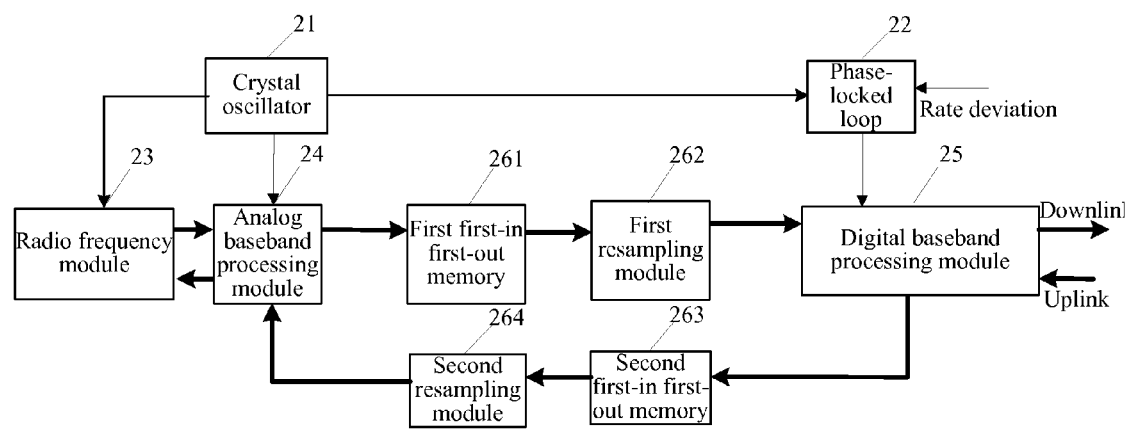
FIG. 3 is a schematic structural diagram of another embodiment of a receiver according to the present invention.

FIG. 3 is a schematic structural diagram of another embodiment of a receiver according to the present invention. As shown in FIG. 3, on the basis of the embodiment shown in FIG. 2, the adjusting module 26 includes: a first first-in first-out memory 261 and a first resampling module 262.

The first first-in first-out memory 261 is configured to buffer the first digital baseband signal output by the analog baseband processing module 24.

The first resampling module 262 is configured to resample the first digital baseband signal buffered by the first first-in first-out memory 241 to obtain the adjusted first digital baseband signal, so that the rate of the adjusted first digital baseband signal is consistent with the rate of the preset reference signal, and send the adjusted first digital baseband signal to the digital baseband processing module 25.

That a user equipment receives a radio signal sent by a base station is used as an example for description. The radio frequency module 23 in the user equipment receives a radio signal, and demodulates the radio signal to obtain an original analog baseband signal, the analog baseband processing module 24 performs analog-to-digital conversion processing on the original analog baseband signal to obtain a first digital baseband signal, and the digital baseband processing module 25 demodulates and decodes the first digital baseband signal to obtain signal source information. In a demodulation process, the digital baseband processing module 25 detects the first digital baseband signal to obtain a rate deviation between the first digital baseband signal and a preset reference signal, and sends the rate deviation to the phase-locked loop. The first first-in first-out memory 261 in the adjusting module 26 buffers the first digital baseband signal, and the first resampling module 262 resamples the first digital baseband signal buffered by the first first-in first-out memory 261 to obtain an adjusted first digital baseband signal, so that a rate of the adjusted first digital baseband signal is consistent with the rate of the preset reference signal, and sends the adjusted first digital baseband signal to the digital baseband processing module 25.

For example, when no clock frequency of the crystal oscillator 21 deviates, it is assumed that a first digital baseband signal output by the analog baseband processing module 24 has 1000 sampling points within each second, that is, a preset reference signal has 1000 sampling points within each second. When a clock frequency of the crystal oscillator 21 deviates and consequently the first digital baseband signal output by the analog baseband processing module 24 has 999 sampling points within each second, the first first-in first-out memory 261 is used to buffer the first digital baseband signal output by the analog baseband processing module 24. When the first resampling module 262 is used to read data buffered in the first first-in first-out memory 261, one sampling point is added to the first baseband processing signal at the end of each second to recover the 1000 sampling points within each second. In this case, the adjusted first digital baseband signal is obtained and sent to the digital baseband processing module 25. When a clock frequency of the crystal oscillator 21 deviates and consequently the first digital baseband signal output by the analog baseband processing module 24 has 1001 sampling points within each second, the first first-in first-out memory 261 is used to buffer the first digital baseband signal output by the analog baseband processing module 24. When the first resampling module 262 is used to read out data buffered in the first first-in first-out memory 261, one sampling point is deleted from the first baseband processing signal at the end of each second to recover the 1000 sampling points within each second. In this case, the adjusted first digital baseband signal is obtained and sent to the digital baseband processing module 25.

Further, the receiver may further include: a first filter, configured to filter the first digital baseband signal adjusted by the adjusting module 26, and output the filtered first digital baseband signal to the digital baseband processing module 25.

The first filter filters the adjusted first digital baseband signal, so that an amplitude value of the adjusted first digital baseband signal is adjusted. That is, a value of each sampling point of the filtered first digital baseband signal is the same as a value of a corresponding sampling point of the first digital baseband signal obtained by means of processing by the analog baseband processing module 24 when no clock frequency of the crystal oscillator 21 deviates.

Still further, on the basis of the embodiment shown in FIG. 2, the adjusting module 26 may further include: a second first-in first-out memory 263 and a second resampling module 264.

The second first-in first-out memory 263 is configured to buffer a second digital baseband signal output by the digital baseband processing module 25, where the second digital baseband signal is a digital baseband signal obtained after the digital baseband processing module 25 codes and modulates the signal source information.

The second resampling module 264 is configured to resample the second digital baseband signal buffered by the second first-in first-out memory 263 to obtain an adjusted second digital baseband signal, so that a rate of the adjusted second digital baseband signal is consistent with the rate of the first digital baseband signal, and send the adjusted second digital baseband signal to the analog baseband processing module 24.

The analog baseband processing module 24 is further configured to perform digital-to-analog conversion processing on the adjusted second digital baseband signal to obtain a to-be-transmitted analog baseband signal, and send the to-be-transmitted analog baseband signal to the radio frequency module 23.

The radio frequency module 23 is further configured to modulate the to-be-transmitted analog baseband signal to obtain a transmit signal, and transmit the transmit signal.

That a user equipment sends a radio signal to a base station is used as an example for description. The digital baseband processing module 25 in the user equipment codes and modulates a to-be-sent original digital signal to generate a second digital baseband signal, and sends the second digital baseband signal to the adjusting module 26. The second first-in first-out memory 263 in the adjusting module 26 buffers the second digital baseband signal. The second resampling module 264 resamples the second digital baseband signal buffered by the second first-in first-out memory 263 to obtain an adjusted second digital baseband signal, and sends the adjusted second digital baseband signal to the analog baseband processing module 24. The analog baseband processing module 24 performs digital-to-analog conversion processing on the adjusted second digital baseband signal to obtain a to-be-transmitted analog baseband signal, and sends the to-be-transmitted analog baseband signal to the radio frequency module 23. The radio frequency module 23 modulates the to-be-transmitted analog baseband signal to obtain a transmit signal, and transmits the transmit signal.

Further, the receiver may further include: a second filter, configured to filter the second digital baseband signal adjusted by the adjusting module 26, and output the filtered second digital baseband signal to the analog baseband processing module 24. The second filter filters the adjusted second digital baseband signal, so that an amplitude value of the adjusted second digital baseband signal is adjusted. That is, a value of each sampling point of the filtered second digital baseband signal is the same as a value of a corresponding sampling point of the second digital baseband signal obtained by means of processing by the analog baseband processing module 24 under the first clock signal.

In addition, a process of sending a radio signal by the user equipment to other user equipments is similar to the above-mentioned process of sending a radio signal by the user equipment to the base station, which is not described herein any further.

In practice, because stability of a crystal oscillator of a base station may be very high, generally the foregoing receiver is deployed in a user equipment. In a case in which the stability of the crystal oscillator of the base station is not high, the foregoing receiver may also be deployed in the base station.

In this embodiment, a digital baseband processing module modulates and decodes a first digital baseband signal to obtain signal source information; detects the first digital baseband signal in a demodulation process to obtain a rate deviation between the first digital baseband signal and a preset reference signal; sends the rate deviation to a phase-locked loop, so that the phase-locked loop adjusts a frequency adjustment coefficient according to the rate deviation sent by the digital baseband processing module, performs frequency division or frequency multiplication processing on a first clock signal according to an adjusted frequency adjustment coefficient to obtain a second clock signal, and sends the second clock signal to the digital baseband processing module to serve as a reference clock of the digital baseband processing module. In addition, a first first-in first-out memory of an adjusting module is used to buffer a first digital baseband signal sent by an analog baseband processing module, and a first resampling module of the adjusting module is used to resample the first digital baseband signal buffered by the first-in first-out memory to obtain an adjusted first digital baseband signal, so that a rate of the adjusted first digital baseband signal is consistent with a rate of the preset reference signal. A second first-in first-out memory of the adjusting module is used to buffer a second digital baseband signal output by the digital baseband processing module, and a second resampling module of the adjusting module is used to resample the second digital baseband signal buffered by the second first-in first-out memory to obtain an adjusted second digital baseband signal, so that a rate of the adjusted second digital baseband signal is consistent with the rate of the first digital baseband signal. In this way, a frequency deviation of a receiver is adjusted on the premise that receiving performance of other receivers connected to a crystal oscillator is not affected.

Finally, it should be noted that the foregoing embodiments are merely intended for describing the technical solutions of the present invention other than limiting the present invention. Although the present invention is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of the present invention.

What is claimed is:

1. A receiver, comprising: a crystal oscillator, a phase-locked loop, a radio frequency module, an analog baseband processing module, an adjusting module, and a digital baseband processing module, wherein:
   the crystal oscillator is configured to separately output a first clock signal as a reference clock to the phase-locked loop, the radio frequency module, and the analog baseband processing module;
   the phase-locked loop is configured to: adjust a frequency adjustment coefficient according to a rate deviation sent by the digital baseband processing module; perform frequency division or frequency multiplication processing on the first clock signal according to an adjusted frequency adjustment coefficient, to obtain a second clock signal; and send the second clock signal to the digital baseband processing module to serve as a reference clock of the digital baseband processing module;
   the radio frequency module is configured to receive a radio signal sent by a transmitter, and demodulate the radio signal to obtain an original analog baseband signal;
   the analog baseband processing module is configured to perform, based on a clock frequency of the first clock signal, analog-to-digital conversion on the original analog baseband signal, to obtain a first digital baseband signal;
   the digital baseband processing module is configured to: demodulate and decode the first digital baseband signal to obtain signal source information; detect the first digital baseband signal in a demodulation process to obtain a rate deviation between the first digital baseband signal and a preset reference signal; and send the rate deviation to the phase-locked loop, wherein the preset reference signal is a digital baseband signal obtained after the analog baseband processing module performs, based on a clock signal with no deviation, the analog-to-digital conversion processing on the original analog baseband signal; and the adjusting module is configured to adjust the first digital baseband signal, so that a rate of an adjusted first digital baseband signal is consistent with a rate of the preset reference signal, and send the adjusted first digital baseband signal to the digital baseband processing module;

wherein the adjusting module comprises: a first first-in first-out memory, a first resampling module, a second first-in first-out memory and a second resampling module, wherein:

the first first-in first-out memory is configured to buffer the first digital baseband signal output by the analog baseband processing module;

the first resampling module is configured to resample the first digital baseband signal buffered by the first first-in first-out memory to obtain the adjusted first digital baseband signal, so that the rate of the adjusted first digital baseband signal is consistent with the rate of the preset reference signal, and send the adjusted first digital baseband signal to the digital baseband processing module;

the second first-in first-out memory is configured to buffer a second digital baseband signal output by the digital baseband processing module wherein the second digital baseband signal is a digital baseband signal obtained after the digital baseband processing module codes and modulates the signal source information;

the second resampling module is configured to resample the second digital baseband signal buffered by the second first-in first-out memory to obtain an adjusted second digital baseband signal, so that a rate of the adjusted second digital baseband signal is consistent with the rate of the first digital baseband signal, and send the adjusted second digital baseband signal to the analogy baseband processing module;

the analog baseband processing module is further configured to perform digital-to-analog conversion on the adjusted second digital baseband signal to obtain a to-be-transmitted analog baseband signal, and send the to-be-transmitted analog baseband signal to the radio frequency module; and the radio frequency module is further configured to modulate the to-be-transmitted analog baseband signal to obtain a transmit signal, and transmit the transmit signal.

2. The receiver according to claim 1, wherein the receiver further comprises:
a first filter, configured to filter the adjusted first digital baseband signal to obtain a filtered first digital baseband signal, and output the filtered first digital baseband signal to the digital baseband processing module.

3. The receiver according to claim 1, wherein the receiver further comprises:
a first filter, configured to filter the adjusted first digital baseband signal to obtain a filtered first digital baseband signal, and output the filtered first digital baseband signal to the digital baseband processing module.

4. The receiver according to claim 2, wherein the receiver further comprises:
a second filter, configured to filter an adjusted second digital baseband signal to obtain a filtered second digital baseband signal, and output the filtered second digital baseband signal to the analog baseband processing module.

5. The receiver according to claim 3, wherein the receiver further comprises:
a second filter, configured to filter the adjusted second digital baseband signal to obtain a filtered second digital baseband signal, and output the filtered second digital baseband signal to the analog baseband processing module.

6. The receiver according to claim 1, wherein the receiver further comprises:
a second filter, configured to filter an adjusted second digital baseband signal to obtain a filtered second digital baseband signal, and output the filtered second digital baseband signal to the analog baseband processing module.

7. The receiver according to claim 1, wherein the receiver further comprises:
a second filter, configured to filter the adjusted second digital baseband signal to obtain a filtered second digital baseband signal, and output the filtered second digital baseband signal to the analog baseband processing module.

8. The receiver according to claim 1, wherein the crystal oscillator is a temperature compensated crystal oscillator TCXO or a digitally compensated crystal oscillator DCXO.

* * * * *